United States Patent
Chong

[11] Patent Number: 5,936,480
[45] Date of Patent: Aug. 10, 1999

[54] SELECTIVE LOADING FOR SIDEBAND NOISE RATIO REDUCTION OF A VOLTAGE CONTROLLED OSCILLATOR

[75] Inventor: Chee Khon Chong, Penang, Malaysia

[73] Assignee: Motorola, Inc., Schaumburg, Ill.

[21] Appl. No.: 09/015,973

[22] Filed: Jan. 30, 1998

[51] Int. Cl.⁶ .................................................... H03B 5/12
[52] U.S. Cl. .................................. 331/117 R; 331/177 V; 331/175; 331/185; 455/256; 455/264
[58] Field of Search ............................ 331/117 R, 177 V, 331/175, 185; 455/255, 256, 258, 259, 262, 264

[56] References Cited

U.S. PATENT DOCUMENTS 4,593,257 6/1986 Wignot ................................ 331/117 R

*Primary Examiner*—Arnold Kinkead
*Attorney, Agent, or Firm*—Dale W. Dorinski

[57] ABSTRACT

A voltage controlled oscillator (1) comprising a voltage controllable variable resonant circuit (2) having a control input (Vctrl), a positive feedback input (6) and a controllable variable frequency output (7). There is an amplifier (3) having an amplifier input coupled to the controllable variable frequency output (7). A positive feedback path (4) couples the amplifier (3) to the positive feedback input (6) and there is selectable load (5) in parallel with the positive feedback path (4) for selectively reducing the SideBand Noise Ratio.

9 Claims, 2 Drawing Sheets

SELECTIVE LOADING FOR SIDEBAND NOISE RATIO REDUCTION OF A VOLTAGE CONTROLLED OSCILLATOR

FIELD OF THE INVENTION

This invention relates to a voltage controlled oscillator having a switch for selective loading thereof to thereby reduce inherent sideband noise ratio. The invention is particularly useful for, but not necessarily limited to, improving bandwidth characteristics of, for example, conventional battery powered voltage controlled oscillators whilst reducing some unnecessary use of battery power.

BACKGROUND ART

Voltage controlled oscillators have been used in the communications industry typically for portable radios, portable telephones and pagers. However, the bandwidth of prior art voltage controlled oscillators may not be sufficient for certain applications. Ideally, voltage controlled oscillators for wideband communication devices should have low current drain to preserve battery life as well as a low SideBand Noise Ratio (SBNR) in order to meet particular adjacent channel selectivity specifications.

In U.S. Pat. No. 4,450,416 a wideband voltage controlled oscillator is described which has a resonant circuit comprising varactors, an inductor and capacitor. A control voltage is applied to cathodes of the varactors to alter their capacitance. Accordingly, the frequency of the voltage controlled oscillator can be controlled by varying the control voltage. One problem with this oscillator is that it requires a relatively small value of capacitance in the resonant circuit which is therefore a limitation on bandwidth.

Disclosed in U.S. Pat. No. 5,144,264 is an open loop gain compensated wideband Colpitts voltage controlled oscillator having a direct current drain that is flatter than other prior art Colpitts voltage controlled oscillators. However, the bandwidth of this wideband voltage controlled oscillator may not be sufficient for all applications.

Hartley wideband voltage controlled oscillators are often used to obtain a wider bandwidth coverage than is achievable by Colpitts voltage controlled oscillators. One disadvantage with conventional Hartley wideband voltage controlled oscillators is that the direct current drain decreases with frequency. This decrease in direct current drain can affect SideBand Noise Ratio performance which is undesirable for certain applications.

Unfortunately, one significant problem of prior art radio frequency wideband voltage controlled oscillators is that in order for them to have a relatively low SideBand Noise Ratio across most of their bandwidth they must use unnecessary current drain therefore battery life is substantially reduced.

SUMMARY OF THE INVENTION

It is an object of the present invention to overcome or alleviate at least one of the problems associated with radio frequency wideband voltage controlled oscillators.

According to one aspect of the invention there is provided a voltage controlled oscillator comprising:

a voltage controllable variable resonant circuit having a control input, a positive feedback input and a controllable variable frequency output;

an amplifier having an amplifier input coupled to said controllable variable frequency output, a positive feedback node and an oscillator output;

a positive feedback path coupling said positive feedback node to said a positive feedback input; and a selectable load coupled to said amplifier, said selectable load being in parallel with said positive feedback path.

Suitably, said amplifier may include one or more transistors and said selectable load is coupled in series with one or more emitter electrodes thereof.

Preferably, said selectable load may have a controllable switch.

Suitably, the controllable switch may be coupled to current saving mode input coupled to a controller.

Suitably, the controller in use may provide a switching signal dependent upon a Radio Frequency interference threshold level or noise threshold level.

Preferably, said controllable switch may be a transistor or any other form of electrically controllable switch.

In an alternative form said controllable switch may include a user controllable mechanical switch.

Suitably, in use said voltage controllable variable resonant circuit may provide for variations in frequency at said controllable variable frequency output in response to variations in direct current voltages applied at said control input.

Suitably, said voltage controllable variable resonant circuit may include voltage controllable capacitors coupled to said control input. Preferably, said voltage controllable capacitors can be varactors having cathodes directly coupled to each other.

Suitably, said voltage controlled oscillator can be configured as a Hartley oscillator.

BRIEF DESCRIPTION OF THE DRAWINGS

In order that the present invention may be readily understood and put into practical affect, reference will now be made to preferred embodiments illustrated in the accompanying drawings in which.

DETAILED DESCRIPTION OF PREFERRED EMBODIMENTS OF THE INVENTION

Figure 1:
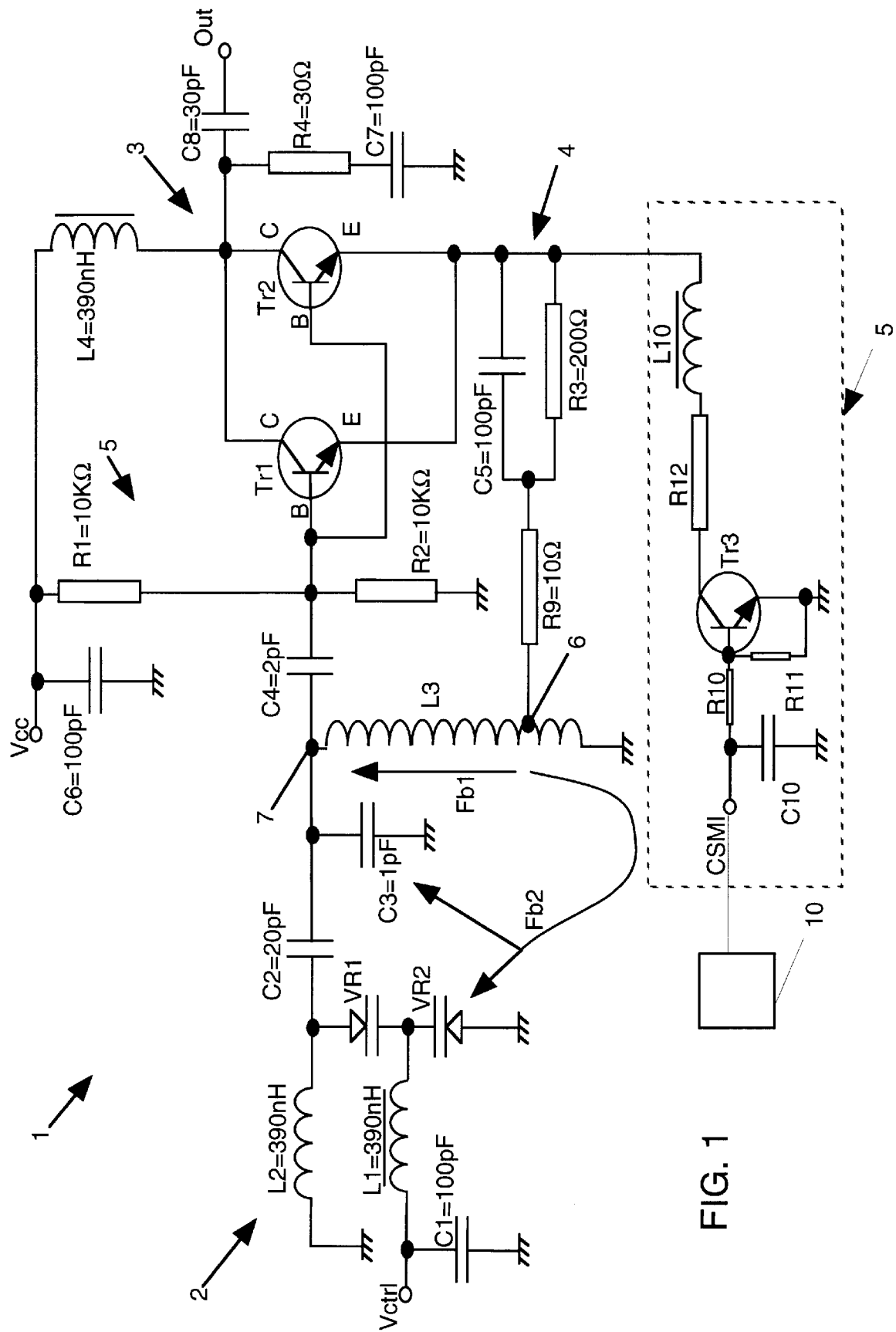
FIG. 1 is a schematic diagram of a voltage controlled oscillator in accordance with a first preferred embodiment of the present invention.

Referring to FIG. 1 there is illustrated a Hartley configured voltage controlled oscillator 1 comprising a voltage controllable variable resonant circuit 2, an amplifier 3, a positive feedback path 4 and a selectable load 5 in parallel with the positive feedback path 4.

The voltage controllable variable resonant circuit 2 has a control input Vctrl, which in use is supplied by a Direct Current (D.C.) Voltage. The voltage controllable variable resonant circuit 2 also has a positive feedback input 6 and a controllable variable frequency output 7. The amplifier 3 includes two parallel coupled transistors Tr1 and Tr2, an amplifier input in the form of base electrodes B of the transistors Tr1,Tr2 coupled the controllable variable frequency output 7 by a coupling capacitor C4. The amplifier 3 also includes a positive feedback node in the form of emitter electrodes E of the transistors Tr1,Tr2 and a negative feedback node in the form of collector electrodes of the transistors Tr1,Tr2. Further, the positive feedback path 4, comprising parallel configured resistor R3 and capacitor C5 in series with a kalty resistor R9, couples the emitter electrodes E to the positive feedback input 6. As will be apparent to a person skilled in the art, the Kalty resistor R9 is for reducing noise that is inversely proportional to frequency (ie 1/f noise).

The voltage controllable variable resonant circuit 2 includes a filter capacitor Cl coupling the control input Vctrl to ground. Also coupled to control input Vctrl is one end of a Radio Frequency Choke L1, the other end of which is coupled to a common node of two voltage controllable back-to-back varactors VR1 and VR2 which in this embodiment are contained in a single chip package. This common node is the cathode electrode of each varactor, these electrodes being directly coupled to each other as will be apparent to a person skilled in the art. The anode electrode of varactor VR2 is directly coupled to ground and the anode electrode of varactor VR1 is indirectly D.C. coupled to ground by an RF blocking inductor L2. The voltage controllable variable resonant circuit 2 also includes an inductor L3, one end of which is coupled to the controllable variable frequency output 7. The other end of inductor L3 is coupled to ground and an intermediate part of inductor L3 has a "tap-off" node providing the positive feedback input 6. The controllable variable frequency output 7 is coupled to the anode electrode of varactor Vr1 by a coupling capacitor C2. Further, there is a capacitor C3 coupled to ground and in parallel with inductor L3.

The voltage controlled oscillator 1 also includes a load in the form of a series connected resistor R4 and capacitor C7 coupling the collector electrodes C to ground. There is also a coupling capacitor C8 coupling the collector electrodes C to an output Out of the voltage controlled oscillator 1. The base electrodes B are biased by a potential divider circuit comprising resistors R1 and R2, a common node of which is coupled to the base electrodes B. One end of resistor R2 is coupled to ground and one end of resistor R1 is coupled to a power supply voltage input Vcc. A filter capacitor C6 couples the power supply voltage input Vcc to ground and an RF choke L4 couples the D.C. power supply voltage input Vcc to the collector electrodes.

The selectable load 5 comprises a switch in the form of a transistor Tr3 having an emitter electrode directly coupled to ground. One end of a load resistor R12 is directly coupled to a collector electrode of transistor Tr3, the other end of the resistor R12 is coupled by an RF choke L10 to the emitter electrodes of Tr1 and Tr2. Transistor Tr3 has biasing resistors R10, R11, as will be apparent to a person skilled in the art, there is also a filter capacitor C10 coupling a Current Saving Mode Input (CSMI) of selectable load 5 to ground. The input CSMI is coupled to a base electrode of transistor Tr3 by resistor R10 and typically the input CSMI is coupled to a controller 10 of a communication device.

In use, to stimulate the voltage controlled oscillator 1 into an oscillatory mode, a direct current voltage is applied to VCC (e.g. 5 Volts). Another direct current voltage which may be between 1 volt and 13 volts is applied to the control voltage input Vctrl from a phase-locked loop circuit (not shown).

Background or white noise appearing at the base electrodes B is usually sufficient to stimulate the voltage controlled oscillator 1. A small portion of the amplified noise appearing at the emitter electrodes E is fed back to base electrodes B through a positive feed back path 4 and through some of the components in the voltage controllable variable resonant circuit 2. In this regard, the feedback path splits into two paths at the feedback input 6, these paths being Fb1 and Fb2. This positive feedback occurs due to a first 180 degree phase shift between the base electrodes B and the emitter electrodes E. A second 180 degree phase shift occurs in due to the reactive components of the voltage controllable variable resonant circuit 2. A total of 360 degrees phase shift has therefore occurred and the amplitude of the signal arriving at the base electrodes B is continuously amplified until resistive losses and non-linearities in the transistors Tr1, Tr2 limit the amplitude of the signal. Further, since the amplification of the signal is at a maximum at a resonance frequency (fr) of the reactive components in the voltage controllable variable resonant circuit 2, the voltage controlled oscillator 1 oscillates at this resonance frequency fo.

In use, when a different frequency is required to be generated at the output Out of the voltage controlled oscillator 1, the D.C. voltage level at the control voltage Vctrl is varied. This will affect the capacitance of the varactors VR1 and VR2 and accordingly the resonance frequency (fr) will also be affected resulting in a new frequency at the output Out.

Advantageously, the present invention when used in a communication device allows for low current drain mode when in a "low noise" or "low Radio Frequency interference" environment. When in a "low noise" environment the controller 10 sends a signal of approximately zero volts to input CSMI of selectable load 5. As a result, transistor Tr3 is switched OFF and the voltage controlled oscillator 1 is in low current drain mode. However, if the environment is above a Radio Frequency threshold level or noise threshold level determined by controller 10, a signal of approximately 5 volts is sent to input CSMI thereby switching transistor Tr3 ON. Accordingly, resistor R12 is coupled to ground thereby the current flow through transistors Tr1,Tr2 is increased and the voltage controlled oscillator 1 will be operating in high current drain mode which improves the SBNR.

Figure 2:
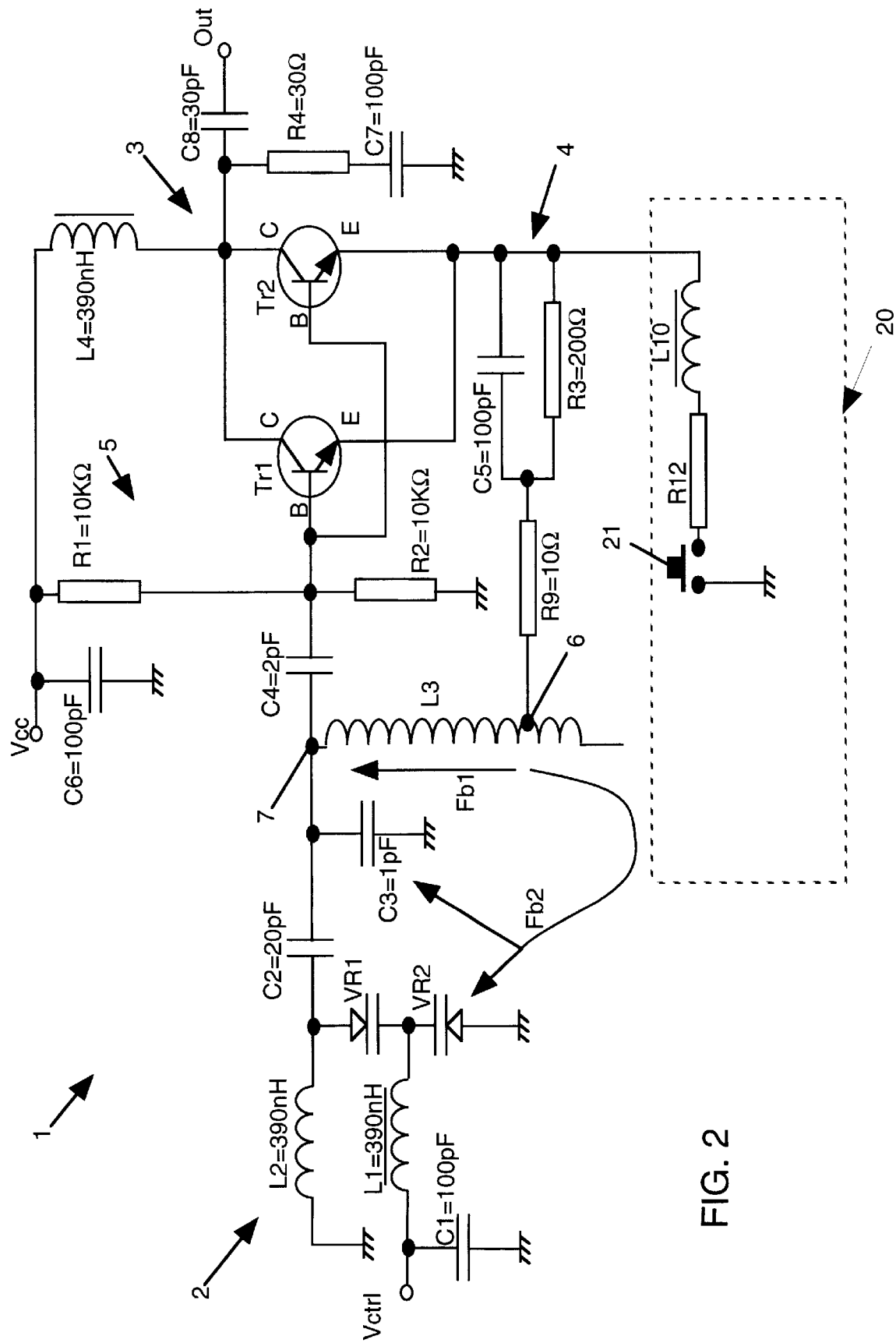
FIG. 2 is a schematic diagram of a voltage controlled oscillator in accordance with a second preferred embodiment of the present invention

Referring to FIG. 2, there is illustrated a second preferred embodiment of the present invention which is similar to the embodiment of FIG. 1 except that the selectable load 5 is replaced with a selectable load 20. To avoid repetition only the selectable load 20 will be described. The selectable load comprises series coupled RF choke L10 and load resistor R12. One end of the load resistor is connected to a terminal of a normally open push button switch 21, the other terminal of the switch 21 is coupled to ground. The Rf choke 10 is coupled to the emitter electrodes E of transistors Tr1,Tr2, thus a user has the option of activating push button switch 21 to couple resistor R12 to ground. As a result, when for instance the user is in a "high Radio Frequency interference environment" current push button switch 21 can be activated and the current flow through transistors Tr1,Tr2 is increased and the voltage controlled oscillator 1 will be operating in high current drain mode which improves the SBNR.

Although the invention has been described with reference to preferred embodiments it is to be understood that the invention is not restricted to the embodiments described herein. For example, the push button switch 21 could be replaced with a toggle switch or any other mechanical, electromechanical, electronic or software switch could be used.

We claim:

1. A voltage controlled oscillator comprising:
   a voltage controllable variable resonant circuit having a control input, a positive feedback input and a controllable variable frequency output;
   an amplifier having an amplifier input coupled to said controllable variable frequency output, a positive feedback node and an oscillator output;

a positive feedback path coupling said positive feedback node to said a positive feedback input;

a selectable load coupled to said amplifier, said selectable load being in parallel with said positive feedback path; and wherein said selectable load has a controllable switch coupled to a current saving mode input coupled to a controller.

2. A voltage controlled oscillator as claimed in claim 1, wherein said amplifier includes one or more transistors and said selectable load is coupled in series with one or more emitter electrodes thereof.

3. A voltage controlled oscillator comprising:

a voltage controllable variable resonant circuit having a control input, a positive feedback input and a controllable variable frequency output;

an amplifier having an amplifier input coupled to said controllable variable frequency output, a positive feedback node and an oscillator output:

a positive feedback path coupling said positive feedback node to said positive feedback input:

a selectable load having a controllable switch, said selectable load coupled to said amplifier and in parallel with said positive feedback path; and wherein in use a controller provides a switching signal dependent upon a Radio Frequency interference threshold level or noise threshold level.

4. A voltage controlled oscillator as claimed in claim 1, wherein said controllable switch is a transistor.

5. A voltage controlled oscillator as claimed in claim 1, wherein said controllable switch includes a user controllable mechanical switch.

6. A voltage controlled oscillator as claimed in claim 1, wherein in use said voltage controllable variable resonant circuit provides for variations in frequency at said controllable variable frequency output in response to variations in direct current voltages applied at said control input.

7. A voltage controlled oscillator as claimed in claim 1, wherein in use said voltage controllable variable resonant circuit provides for variations in frequency at said controllable variable frequency output in response to variations in direct current voltages applied at said control input.

8. A voltage controlled oscillator as claimed in claim 1, wherein said voltage controllable variable resonant circuit includes voltage controllable capacitors coupled to said control input.

9. A voltage controlled oscillator as claimed in claim 1, wherein said voltage controlled oscillator is configured as a Hartley oscillator.

* * * * *